United States Patent
Asaoka et al.

(10) Patent No.: US 8,596,765 B2
(45) Date of Patent: Dec. 3, 2013

(54) LIQUID EJECTING HEAD, LIQUID EJECTING APPARATUS, AND PIEZOELECTRIC ELEMENT

(75) Inventors: Ichiro Asaoka, Chino (JP); Toshihiro Shimizu, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 338 days.

(21) Appl. No.: 12/914,405

(22) Filed: Oct. 28, 2010

(65) Prior Publication Data
US 2011/0102515 A1    May 5, 2011

(30) Foreign Application Priority Data
Nov. 3, 2009  (JP) .................. 2009-252510

(51) Int. Cl.
*B41J 2/045*  (2006.01)
*H01L 41/00*  (2013.01)
*H02N 2/00*  (2006.01)

(52) U.S. Cl.
USPC .......................... 347/68; 310/311

(58) Field of Classification Search
None
See application file for complete search history.

(56) References Cited

U.S. PATENT DOCUMENTS

| | | | |
|---|---|---|---|
| 6,025,205 A * | 2/2000 | Park et al. ............. | 438/3 |
| 7,896,480 B2 * | 3/2011 | Kazama et al. ......... | 347/68 |
| 2007/0007860 A1 * | 1/2007 | Takabe et al. .......... | 310/324 |

FOREIGN PATENT DOCUMENTS

JP    2006-093312    4/2006

* cited by examiner

*Primary Examiner* — Matthew Luu
*Assistant Examiner* — Erica Lin
(74) *Attorney, Agent, or Firm* — Workman Nydegger

(57) ABSTRACT

A piezoelectric element has a first electrode, a piezoelectric layer, and a second electrode. The first electrode is preferentially oriented along the (111) plane in the direction parallel to the film surface and, in the direction perpendicular to the film surface, the sum of the (111) and (200) planes relative to the sum of the (111), (200), and (220) planes is 20% or less in terms of the abundance ratio.

6 Claims, 5 Drawing Sheets

LIQUID EJECTING HEAD, LIQUID EJECTING APPARATUS, AND PIEZOELECTRIC ELEMENT

CROSS-REFERENCE TO RELATED APPLICATIONS

This application claims the benefit of priority to Japanese Patent Application No. 2009-252510 filed Nov. 3, 2009, the contents of which are hereby incorporated by reference in their entirety.

BACKGROUND

1. Technical Field

The present invention relates to a liquid ejecting head having a piezoelectric element that includes a first electrode, a piezoelectric layer, and a second electrode and causes changes in the pressure in pressure-generating chambers communicating with nozzle orifices. The invention also relates to a liquid ejecting apparatus and a piezoelectric element.

2. Related Art

A piezoelectric element used in a liquid ejecting head is formed of two electrodes and a piezoelectric material sandwiched therebetween that has a function of an electromechanical transducer, for example, a piezoelectric layer composed of a crystallized dielectric material. Such a piezoelectric element is, for example, mounted in a liquid ejecting head as an actuator that operates in a flexural oscillation mode. A typical example of a liquid ejecting head is, for example, an ink jet recording head in which a pressure-generating chamber communicating with a nozzle orifice that discharges ink droplets is partly formed of a diaphragm. The diaphragm is deformed by the piezoelectric element and thereby applies pressure to the ink in the pressure-generating chamber to discharge an ink droplet from the nozzle orifice. One example of such a piezoelectric element mounted in an ink jet recording head is formed by the following process: a first electrode film is formed on one surface of a substrate (passage-forming substrate) by sputtering or another method; a piezoelectric layer composed of lead zirconate titanate (PZT) or the like is then formed on the first electrode film by a sol-gel process or a liquid phase method such as a metal-organic decomposition (MOD) method; a second electrode is formed on the piezoelectric layer by sputtering; and the piezoelectric layer and the second electrode are patterned (refer to JP-A-2006-093312, for example).

The arrangement of such piezoelectric elements has become more and more dense to improve the printing quality. Recently, further densification has been desired; however, a very dense arrangement of piezoelectric elements requires a reduction in the size of each piezoelectric element. This poses a problem in that necessary piezoelectric properties (amount of deflection) cannot be obtained for a size-reduced piezoelectric element. Therefore, a piezoelectric element that can achieve a greater deformation with a relatively small drive voltage is required. It is to be noted that this is a problem not only in liquid ejecting heads, representative examples of which being ink jet recording heads, but also in piezoelectric elements that are mounted in other apparatuses.

SUMMARY

An advantage of some aspects of the invention is that a liquid ejecting head and a liquid ejecting apparatus that have excellent piezoelectric properties and a piezoelectric element for use therein are provided.

A liquid ejecting head according to an aspect of the invention that solves the above problem includes a pressure-generating chamber that communicates with the nozzle orifice, and a piezoelectric element. The piezoelectric element has a first electrode, a piezoelectric layer formed on the first electrode, and a second electrode formed on the piezoelectric layer. The first electrode is preferentially oriented along the (111) plane in a direction parallel to the film surface and, in a direction perpendicular to the film surface, the sum of the (111) and (200) planes relative to the sum of the (111), (200), and (220) planes is 20% or less in terms of the abundance ratio.

In a liquid ejecting head according to this aspect of the invention, by preferentially orienting the first electrode along the (111) plane in a direction parallel to the film surface and, in a direction perpendicular to the film surface, making the sum of the (111) and (200) planes relative to the sum of the (111), (200), and (220) planes be 20% or less in terms of the abundance ratio, the crystals of the first electrode become more uniformly aligned and excellent piezoelectric properties can be obtained for the piezoelectric element because of the large amount of deflection thereof.

The first electrode preferably contains at least one of the following materials: platinum, iridium, palladium, and rhodium. In that case, the liquid ejecting head includes a piezoelectric element having the first electrode containing at least one of the above materials and excellent piezoelectric properties because of the large amount of deflection thereof.

A layer containing titanium or titanium oxide may be provided on the first electrode and the piezoelectric layer may be provided on the layer containing titanium or titanium oxide. In that case, for example, the piezoelectric layer composed of lead zirconate titanate can be preferentially oriented along the (100) plane, which increases the amount of deflection of the piezoelectric element.

Another aspect of the invention provides a liquid ejecting apparatus having the liquid ejecting head according to the above-described aspect of the invention. A liquid ejecting apparatus according to this aspect can possess excellent discharge properties since the liquid ejecting head has excellent piezoelectric properties because of the large amount of deflection thereof.

Still another aspect of the invention provides a piezoelectric element including a first electrode, a piezoelectric layer formed on the first electrode, and a second electrode formed on the piezoelectric layer. The first electrode is preferentially oriented along the (111) plane in a direction parallel to the film surface and, in a direction perpendicular to the film surface, the sum of the (111) and (200) planes relative to the sum of the (111), (200), and (220) planes is 20% or less in terms of the abundance ratio. In that case, the crystals of the first electrode become more uniformly aligned and the piezoelectric element can possess excellent piezoelectric properties because of the large amount of deflection thereof.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
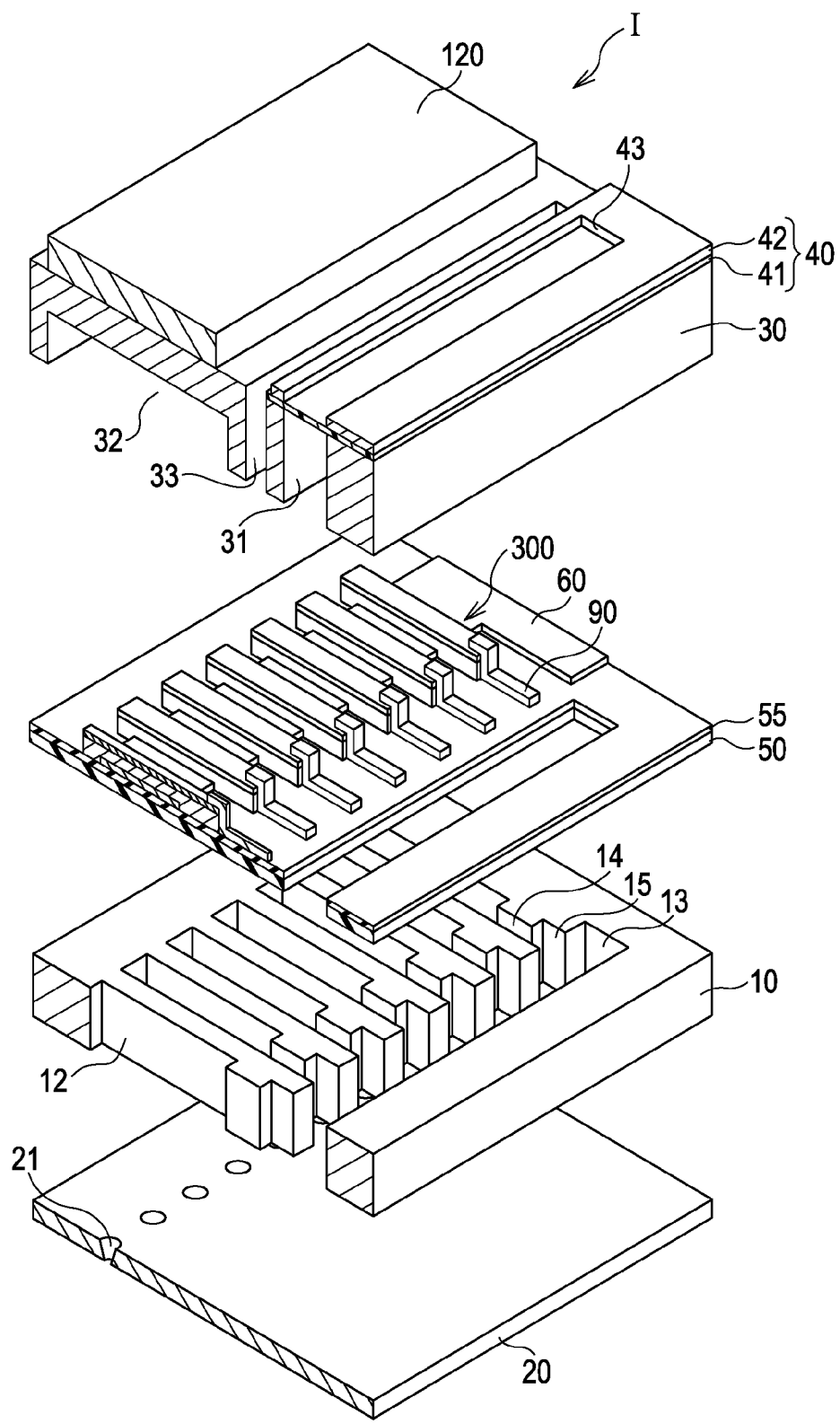
FIG. 1 is an exploded perspective view illustrating the general structure of a recording head according to a first embodiment.
Figure 2A:
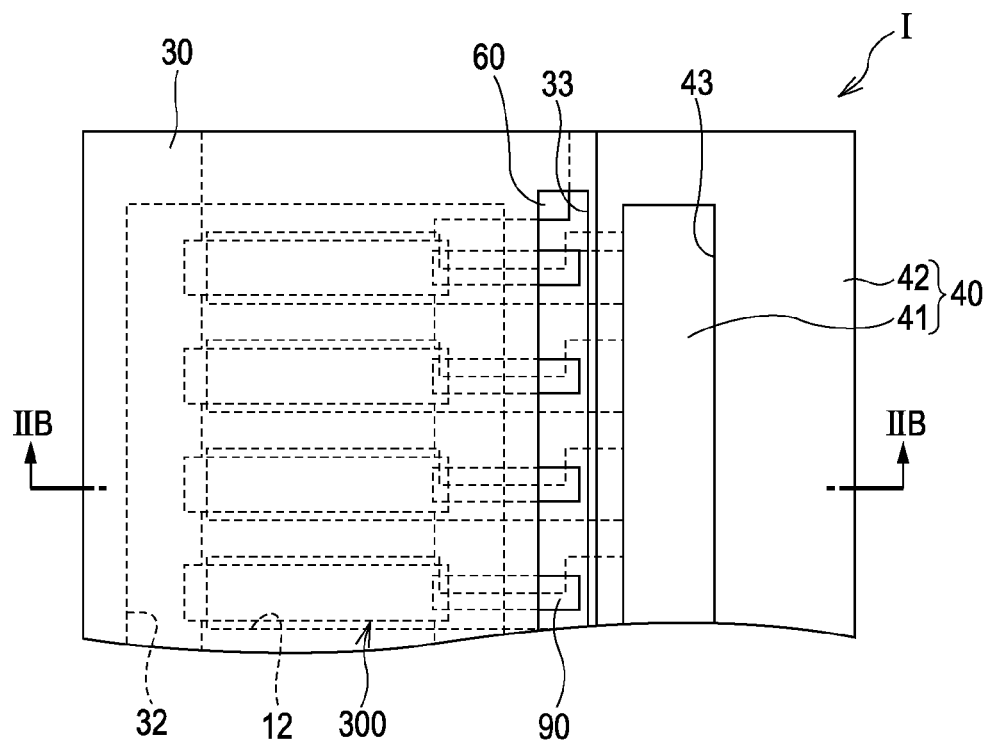
FIG. 2A is a plan view of a recording head according to the first embodiment.

FIG. 1 is an exploded perspective view illustrating the general structure of an ink jet recording head, which is an example of a liquid ejecting head according to a first embodiment of the invention. FIG. 2A is a plan view of the ink jet recording head of FIG. 1, and FIG. 2B is a sectional view taken along line IIB-IIB of FIG. 2A.

Figure 2B:
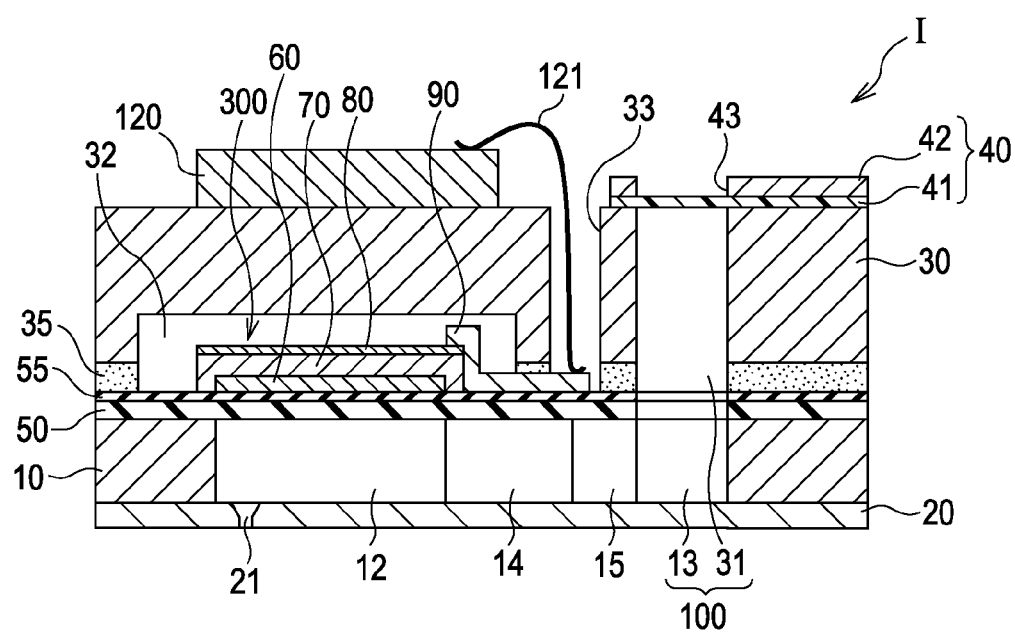
FIG. 2B is a sectional view of a recording head according to the first embodiment.

As illustrated in FIGS. 1, 2A, and 2B, a passage-forming substrate 10 of this embodiment is formed of a silicon single-crystal substrate. An elastic film 50 composed of silicon dioxide is formed on one surface of the passage-forming substrate 10.

A plurality of pressure-generating chambers 12 are provided in the passage-forming substrate 10 in parallel with one another in the width direction of the passage-forming substrate 10. In addition, a communicating section 13 is formed in the passage-forming substrate 10 in a region outside the pressure-generating chambers 12 in the length direction of the pressure-generating chambers 12. The communicating section 13 communicates with each of the pressure-generating chambers 12 through an ink supply path 14 and a communicating path 15, both of which are provided for each pressure-generating chamber 12. The communicating section 13 communicates with a reservoir section 31 in a protection substrate, which will be described later, so as to constitute a part of a reservoir that is used as a common ink chamber for the pressure-generating chambers 12. The ink supply paths 14 are formed so that each one has a width smaller than that of the pressure-generating chambers 12, thereby maintaining a constant passage resistance that is applied to ink flowing into the pressure-generating chambers 12 from the communicating section 13. Although the ink supply paths 14 in this embodiment are formed by narrowing the passages from one side, the ink supply paths 14 may be formed by narrowing the passages from both sides. Alternatively, the ink supply paths 14 may be formed by narrowing the passages in the thickness direction instead of the width direction. The passage-forming substrate 10 in this embodiment is thus provided with liquid passages including the pressure-generating chambers 12, the communicating section 13, the ink supply paths 14, and the communicating paths 15.

A nozzle plate 20 is attached to the open surface side of the passage-forming substrate 10 with an adhesive, a thermally fusing film, or the like. The nozzle plate 20 is provided with nozzle orifices 21 each communicating with the corresponding pressure-generating chamber 12 at a portion near the end of the pressure-generating chamber 12 opposite the corresponding ink supply path 14. The nozzle plate 20 is formed of, for example, a glass ceramic, a silicon single-crystal substrate, stainless steel or another material.

As mentioned above, the elastic film 50 is formed on the opposite side to the open surface side of the passage-forming substrate 10. An insulator film 55 that is composed of zirconium oxide or the like and has a surface roughness (Ra) of, for example, 0.05 to 2 nm is formed on the elastic film 50.

Furthermore, a first electrode 60, a titanium oxide layer that is composed of titanium oxide and has a thickness of, for example, 0.1 to 20 nm, a thin-film piezoelectric layer 70 having a thickness of 2 μm or less, preferably 0.3 to 1.5 μm, and a second electrode 80 are stacked on the insulator film 55 and thereby form a piezoelectric element 300. Although a layer composed of titanium oxide (titanium oxide layer) is provided between the first electrode 60 and the piezoelectric layer 70 in this embodiment, a layer composed of titanium may be provided instead of the titanium oxide layer. Alternatively, the piezoelectric layer 70 may be directly provided on the first electrode 60 without providing the titanium oxide layer or the like. Alternatively, a layer composed of titanium oxide may be provided between the insulator film 55 and the first electrode 60 for purposes such as improving the adhesion between the piezoelectric element 300 and the insulator film 55.

The term piezoelectric element 300 herein refers to a portion including the first electrode 60, the piezoelectric layer 70, and the second electrode 80. The piezoelectric elements 300 are generally fabricated by forming either the first or the second electrode as a common electrode and patterning the other electrode and the piezoelectric layer 70 for each pressure-generating chamber 12. Although the first electrode 60 is formed as a common electrode of the piezoelectric elements 300 and the second electrodes 80 are formed as separate electrodes of the piezoelectric elements 300 in this embodiment, this configuration may be reversed for convenience of a drive circuit or wiring. The piezoelectric element 300 and a diaphragm that exhibits displacement upon activation of the piezoelectric element 300 are together referred to as an actuator herein. In the above-described case, the elastic film 50, the insulator film 55, and the first electrode 60 act as a diaphragm. Needless to say, however, the structure of the diaphragm is not limited to that. For example, the elastic film 50 and the insulator film 55 may be omitted and the first electrode 60 may act as a diaphragm by itself. Alternatively, the piezoelectric element 300 itself may double as a diaphragm in effect.

The first electrode 60 may be composed of platinum (Pt), iridium (Ir), palladium (Pd), or rhodium (Rh), or may be formed by stacking, oxidizing, alloying, or mixing these metals.

According to an aspect of the invention, the first electrode 60 is preferentially oriented along the (111) plane in a direction parallel to the film surface. In a direction perpendicular to the film surface, the sum of the (111) and (200) planes relative to the sum of the (111), (200), and (220) planes is 20% or less, preferably 18% or less, in terms of the abundance ratio.

The orientation of the first electrode 60 in the direction parallel to the film surface is the orientation of the crystals measured from a surface of the first electrode 60 on the piezoelectric layer 70 side. It can be measured by the wide-angle X-ray diffraction method or the like. The above expression "preferentially oriented along the (111) plane in the direction parallel to the film surface" includes a condition in which all the crystals are oriented along the (111) plane in the direction parallel to the film surface and a condition in which most of the crystals (for example, 90% or more) are oriented along the (111) plane in the direction parallel to the film surface.

The orientation of the first electrode 60 in the direction perpendicular to the film surface is the orientation of the crystals along a plane perpendicular to the surface of the first electrode 60 on the piezoelectric layer 70 side, that is, a plane of the first electrode 60 in the thickness direction. It can be measured by in-plane diffraction, electron backscatter diffraction (EBSD), or another method.

By preferentially orienting the first electrode 60 along the (111) plane in the direction parallel to the film surface and, in the direction perpendicular to the film surface, making the sum of the (111) and (200) planes relative to the sum of the (111), (200), and (220) planes be 20% or less in terms of the abundance ratio as described above, the crystals of the first electrode 60 become more uniformly aligned with the (111) plane than when the first electrode 60 is only preferentially oriented along the (111) plane in the direction parallel to the film surface. Therefore, as illustrated in the examples that will be described later, the crystal faces of the piezoelectric layer 70, which is provided on the first electrode 60, are aligned and the degree of orientation thereof increases, which substantially improves the piezoelectric properties of the piezoelectric element 300. Furthermore, since the piezoelectric element 300 can be made to securely possess excellent piezoelectric properties by defining the first electrode 60 as above, variation in the piezoelectric properties can be reduced when a plurality of piezoelectric elements 300 are arranged. Therefore, it is possible to stabilize the discharge properties and other properties of the ink jet recording head I.

In general, when it is stated that an electrode is preferentially oriented along the (111) plane, the evaluation is performed only with respect to the orientation in the direction parallel to the film surface, which can be measured by the wide-angle X-ray diffraction method. In other words, even if the first electrode 60 is evaluated as, for example, having a single orientation along the (111) plane, since the first electrode 60 is evaluated only with respect to the direction parallel to the film surface, the crystals that do not have crystal faces parallel to the film surface are not evaluated at all. In the case of a first electrode 60 having layered metal films, it is difficult to evaluate only the outermost metal film that is nearest to the piezoelectric layer 70 by the wide-angle X-ray diffraction method. This is because the diffraction lines of the respective metal films interfere with each other.

On the other hand, when the first electrode 60 is measured in the direction perpendicular to the film surface on the piezoelectric layer 70 side by in-plane diffraction or another method, the crystal faces perpendicular to the surface of the first electrode 60 on the piezoelectric layer 70 side, which are not evaluated by the wide-angle X-ray diffraction method or the like, can be evaluated. Therefore, even if the first electrode 60 has been evaluated as having a single orientation along the (111) plane by the wide-angle X-ray diffraction method, the crystals of the first electrode 60 that are not oriented along the (111) plane can be evaluated. This allows the crystals of the first electrode 60 to be more uniformly aligned. In addition, by using low angle X-rays that are radiated at an angle near the critical angle, even if the first electrode 60 is formed of stacked films, only the outermost film nearest to the piezoelectric layer 70 can be evaluated.

As has been seen above, in an aspect of the invention, the first electrode 60 is preferentially oriented along the (111) plane in the direction parallel to the film surface and, in the direction perpendicular to the film surface, the sum of the (111) and (200) planes relative to the sum of the (111), (200), and (220) planes is arranged to be 20% or less in terms of the abundance ratio, so that excellent piezoelectric properties can be obtained. When the first electrode 60 that has been preferentially oriented along the (111) plane in the direction parallel to the film surface is measured with respect to the orientation thereof in the direction perpendicular to the film surface, diffraction lines derived from not only the (220) plane but also the (111) and (200) planes are observed. This indicates the presence of crystals oriented along a plane other than the (111) plane.

It is to be noted that diffraction intensity in X-ray diffraction such as in-plane diffraction is affected by the electron distribution in the crystal face that causes diffraction. For this reason, the intensity ratio of diffraction lines does not directly indicate the abundance ratio of crystals. In order to correct diffraction intensity, which depends on the diffraction surface, and compare the number of crystals that are oriented in a certain direction, the diffraction intensity needs to be normalized using the diffraction intensities of a powder sample whose orientation is expected to be completely random. The correction herein was carried out as follows. An ICDD card (PDF#06-0598), which is a collection of X-ray diffraction databases, was used as a data of a powder sample whose orientation was expected to be completely random in order to calculate normalization coefficients. For example, the normalization coefficient of (111) is expressed by the equation below. The values of the diffraction intensities used herein were ones stored in the above-mentioned PDF#06-0598.

Normalization coefficient of (111)=Sum of diffraction intensities of (111), (200), and (220)/Diffraction intensity of (111)

By using these normalization coefficients, the abundance ratio of, for example, (111) was calculated with the following equation:

(111)abundance ratio=(Measured value of (111)intensity×(111)normalization coefficient)/(Measured value of (111)intensity×(111)normalization coefficient+Measured value of (200)intensity×(200) normalization coefficient+Measured value of (220)intensity×(220)normalization coefficient)

Each measured intensity can thus be converted into an abundance ratio by the above method when measurement is performed with in-plane diffraction.

Examples of the material of the piezoelectric layer 70 that forms the piezoelectric element 300 include, but are not limited to, a ferroelectric piezoelectric material such as lead zirconate titanate (PZT) and a relaxer ferroelectric, which is obtained by adding a metal such as niobium, nickel, magnesium, bismuth, or yttrium to a ferroelectric piezoelectric material. The piezoelectric layer 70 is preferably a compound oxide that has a perovskite structure, that is, an $ABO_3$ structure. When a perovskite structure is employed, the piezoelectric layer 70 can be made to more securely accord with the orientation of the first electrode 60 that has been made to have a certain crystal orientation. For example, when a titanium oxide layer and a piezoelectric layer 70 composed of lead zirconate titanate are provided on the first electrode 60 in this order, the piezoelectric layer 70 can be preferentially oriented along the (100) plane. The expression "preferentially oriented along the (100) plane" includes a condition in which all the crystals are oriented along the (100) plane and a condition in which most of the crystals (for example, 90% or more) are oriented along the (100) plane. When a piezoelectric layer 70 composed of lead zirconate titanate is provided directly on the first electrode 60, the piezoelectric layer 70 can be strongly oriented along the (111) plane.

The process for forming such a piezoelectric element 300 on the passage-forming substrate 10 is not particularly limited, but, for example, a piezoelectric element 300 can be fabricated by the following process. First, a silicon dioxide film composed of silicon dioxide ($SiO_2$) or the like, which forms an elastic film 50, is formed on a silicon wafer that is used as a passage-forming substrate 10. An insulator film 55 composed of zirconium oxide or the like is then formed on the elastic film 50 (silicon dioxide film). After that, if necessary, a layer composed of titanium is provided on the insulator film 55.

A first electrode 60 composed of platinum, iridium, or the like is then formed by sputtering or another method on the entire surface of the insulator film 55 or the layer composed of titanium provided according to need. After that, the first electrode 60 is subjected to patterning. By appropriately adjusting the fabrication conditions of the first electrode 60, namely sputtering conditions such as temperature, pressure, and power density, the crystals of the first electrode 60 to be fabricated can be controlled. That is, the first electrode 60 is preferentially oriented along the (111) plane in the direction parallel to the film surface and, in the direction perpendicular to the film surface, the sum of the (111) and (200) planes relative to the sum of the (111), (200), and (220) planes is made to be 20% or less in terms of the abundance ratio. The sum of the (111) and (200) planes relative to the sum of the (111), (200), and (220) planes (abundance ratio) in the direction perpendicular to the film surface can be further reduced by, for example, reducing the pressure or increasing the power density, although the result varies depending on other conditions. The thickness of metal films that form the first electrode 60 is not particularly limited, but each metal film preferably has a thickness of about, for example, 5 to 200 nm.

A layer that is composed of titanium and has a thickness of 6 nm or less is then provided on the first electrode 60 if necessary. After that, a piezoelectric layer 70 is stacked on the first electrode 60 or the layer composed of titanium provided according to need. The process for fabricating the piezoelectric layer 70 is not particularly limited, but, for example, the piezoelectric layer 70 may be formed by a so-called sol-gel process. In the sol-gel process, the piezoelectric layer 70 composed of a metal oxide is obtained by gelling a sol composed of organometallic compounds that are dissolved or dispersed in a solvent through application and drying, and firing the resultant gel at a high temperature. The process for fabricating the piezoelectric layer 70 is not limited to the sol-gel process. For example, a liquid phase method such as a metal-organic decomposition (MOD) method, or a physical vapor deposition (PVD) method, a chemical vapor deposition (CVD) method, or the like may be used.

First, for example, a sol or a solution for the MOD method containing organometallic compounds that have the component metals of a piezoelectric material for the piezoelectric layer 70 (precursor solution) is applied to the first electrode 60 by a spin coating method or the like. A piezoelectric precursor film is thus formed (application step).

The precursor solution to be applied is, for example, one in which organometallic compounds each containing a component metal of a piezoelectric material for the piezoelectric layer 70 are dissolved or dispersed in an organic solvent such as alcohol. Here, the organometallic compounds have been mixed so that a desired molar ratio is achieved for each component metal. For an organometallic compound containing a component metal of a piezoelectric material, for example, a metal alkoxide, an organic acid salt, a β-diketone complex, or the like may be used. More specifically, the following organometallic compounds are usable. An organometallic compound containing lead (Pb) may be, for example, lead acetate. An organometallic compound containing zirconium (Zr) may be, for example, zirconium acetylacetonate, zirconium tetraacetylacetonate, zirconium monoacetylacetonate, or zirconium bisacetylacetonate. An organometallic compound containing titanium (Ti) may be, for example, titanium alkoxide or titanium isopropoxide.

The piezoelectric precursor film is then heated to a predetermined temperature, for example, a temperature between about 300° C. and 400° C. so as to be dried for a certain period of time (drying step). After that, the dried piezoelectric precursor film is heated to a predetermined temperature and kept in that condition for a certain period of time, so that the piezoelectric precursor film is degreased (degreasing step). Here, "degreasing" means that the organic components contained in the piezoelectric precursor film are removed in the form of, for example, $NO_2$, $CO_2$, and $H_2O$. The piezoelectric precursor film is then heated to a predetermined temperature, for example, a temperature between about 650° C. and 800° C. and kept in that condition for a certain period of time, so that the piezoelectric precursor film is crystallized to form a piezoelectric film (firing step). A heating device used for drying, degreasing, and firing steps may be a rapid thermal annealing (RTA) apparatus that applies heat by irradiation from an infrared lamp, a hot plate, or the like.

A piezoelectric layer that has a plurality of piezoelectric films may be formed by repeating the above-described application, drying, and degreasing steps or application, drying, degreasing, and firing steps several times according to the desired thickness or other desired properties of the film.

After the piezoelectric layer 70 is formed, a second electrode 80 composed of a metal such as platinum is stacked on the piezoelectric layer 70. The piezoelectric layer 70 and the second electrode 80 are simultaneously subjected to patterning to form the piezoelectric element 300.

A post-annealing may then be performed at a temperature between 600° C. and 700° C. if necessary. In that case, good interfaces between the piezoelectric layer 70 and the first electrode 60 and between the piezoelectric layer 70 and second electrode 80 can be formed. The post-annealing also improves the crystallinity of the piezoelectric layer 70.

Examples will be provided hereinafter in order to describe the invention more specifically; however, the invention is not limited to these examples.

Example 1

First, a silicon dioxide film was formed on the surface of a silicon substrate by thermal oxidation. Zirconium was then deposited on the silicon dioxide film by sputtering to form a film and this film was thermally oxidized. As a result, a zirconium oxide film having a surface roughness (Ra) of 0.05 to 2 nm was formed on the silicon dioxide film. A titanium film was then formed on the zirconium oxide film by sputtering.

Figure 3:
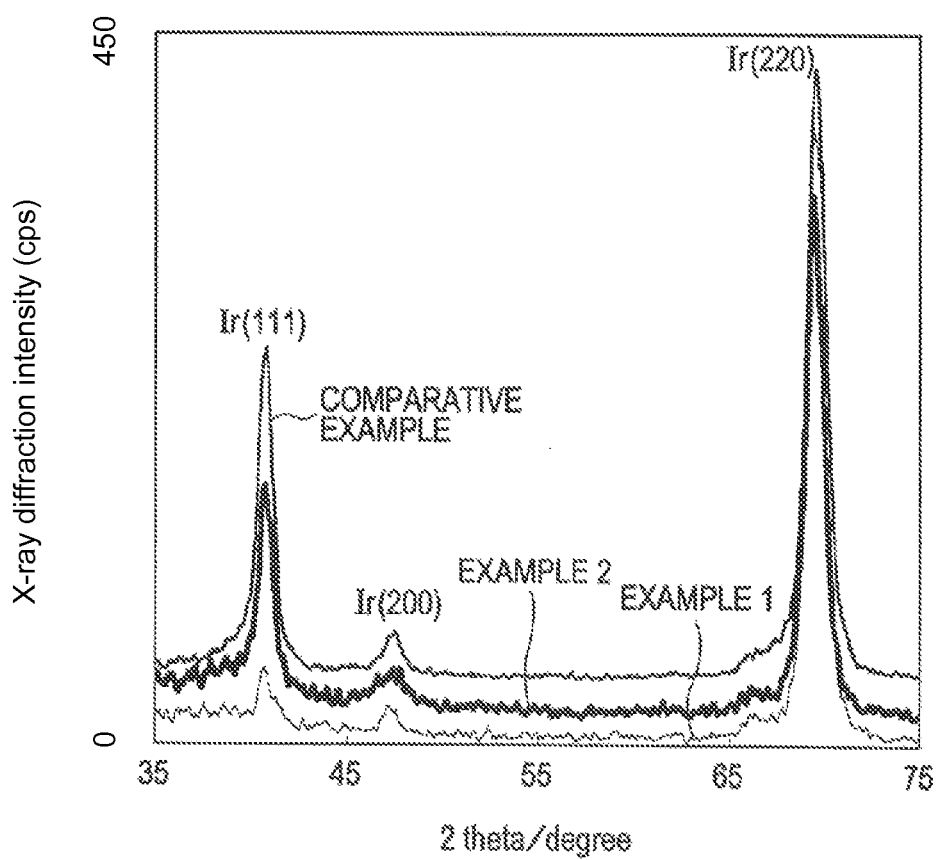
FIG. 3 is a diagram illustrating the results of in-plane diffraction performed on first electrodes of Examples and Comparative Example.

After that, a platinum film having a thickness of 60 nm was formed on the titanium film by DC sputtering. An iridium film having a thickness of 20 nm was formed on the platinum film by DC sputtering so as to fabricate a first electrode 60. The platinum film and the iridium film were formed under the following conditions: a plasma power density of 40 kW/m$^2$; a substrate temperature of 200° C. or less; and an argon pressure of 0.1 Pa. When the first electrode 60 that had been formed was subjected to measurement by the wide-angle X-ray diffraction method, it was found that the first electrode 60 was preferentially oriented (orientation ratio of 90% or more) along the (111) plane. The results of in-plane diffraction performed on the first electrode 60 are as shown in FIG. 3. As illustrated in FIG. 3, the diffraction lines of both the crystal faces that indicate the presence of crystals oriented along a plane other than the (111) plane ((111) and (200) planes) and the crystal faces that indicate the presence of crystals oriented along the (111) plane ((220) plane) were obtained. By applying the obtained intensity ratios to the above-described method, the sum of the abundance ratios of the (111) and (200) planes relative to the sum of the abundance ratios of the (111), (200), and (220) planes in the direction perpendicular to the film surface, that is, (the abundance ratio of the (111) plane+the abundance ratio of the (200) plane)/(the abundance ratio of the (111) plane+the abundance ratio of the (200) plane+the abundance ratio of the (220) plane) was calculated. The value was 7.8%.

A titanium layer having a thickness of 2 nm was then formed on the first electrode 60 by sputtering.

On this titanium layer, a piezoelectric layer 70 was formed by a sol-gel process. The procedure was as follows. First, a precursor solution that had been obtained by mixing lead acetate trihydrate ($Pb(CH_3COO)_2 \cdot 3H_2O$), titanium isopropoxide ($Ti[OCH(CH_3)_2]4$), and zirconium acetylacetonate ($Zr(CH_3COCHCOCH_3)_4$) as main components, butyl cellosolve ($C_6H_{14}O_6$) as a solvent, diethanolamine ($C_4H_{11}NO_2$) as a stabilizer, and polyethylene glycol ($C_2H_6O_6$) as a thickener was applied to the first electrode 60 by a spin coating method. A piezoelectric precursor film was thus formed (application step). Here, the mixing ratio of the precursor solution was as follows: lead acetate trihydrate:titanium isopropoxide:zirconium acetylacetonate:butyl cellosolve:diethanolamine:polyethylene glycol=1.1:0.44:0.56:3:0.65:0.5 (molar ratio). The lead acetate trihydrate was added 10% in excess in consideration of loss due to evaporation. The piezoelectric precursor film was then subjected to heat treatments of 80° C. (drying step) and 360° C. (degreasing step), and was fired at 700° C., so that the piezoelectric precursor film was crystallized (firing step). A piezoelectric layer 70 that was composed of lead zirconate titanate and had a thickness of about 1,100 nm and a perovskite structure was thus formed.

Figure 4:
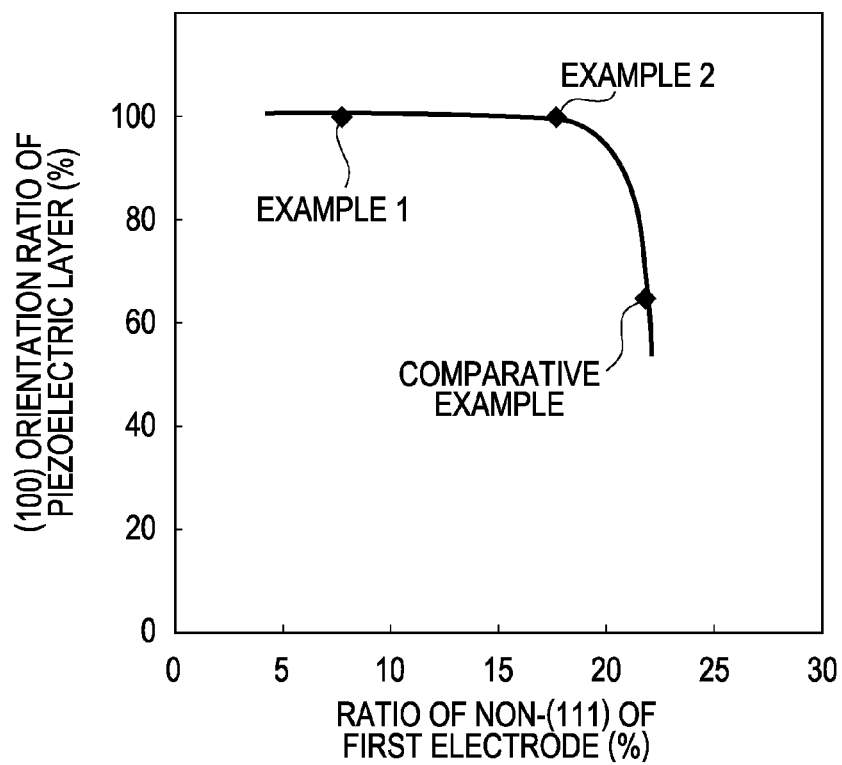
FIG. 4 is a graph illustrating the (100) orientation ratios of piezoelectric layers of Examples and Comparative Example.

The orientation ratio of the obtained piezoelectric layer 70 along the (100) plane was then measured by the wide-angle X-ray diffraction method. It was found that the piezoelectric layer 70 was preferentially oriented (orientation ratio of 90% or more) along the (100) plane. In addition, diffraction peaks derived from a perovskite structure were observed and therefore the piezoelectric layer 70 was confirmed as having a perovskite structure. FIG. 4 shows the sum of the abundance ratios of the (111) and (200) planes relative to the sum of the abundance ratios of the (111), (200), and (220) planes in the direction perpendicular to the film surface (referred to as "ratio of non-(111)" hereinafter) that was calculated from the results of in-plane diffraction performed on the first electrode 60 along the abscissa, and the orientation ratio along the (100) plane along the ordinate. The orientation ratio of the piezoelectric layer 70 along the (100) plane was calculated by the following equation:

(100)orientation ratio=(100)diffraction intensity/
((100)diffraction intensity+(110)diffraction
intensity+(111)diffraction intensity)

A platinum film was then formed on the piezoelectric layer 70 as a second electrode 80 by DC sputtering. A piezoelectric element 300 was thus formed.

Example 2

Figure 5:
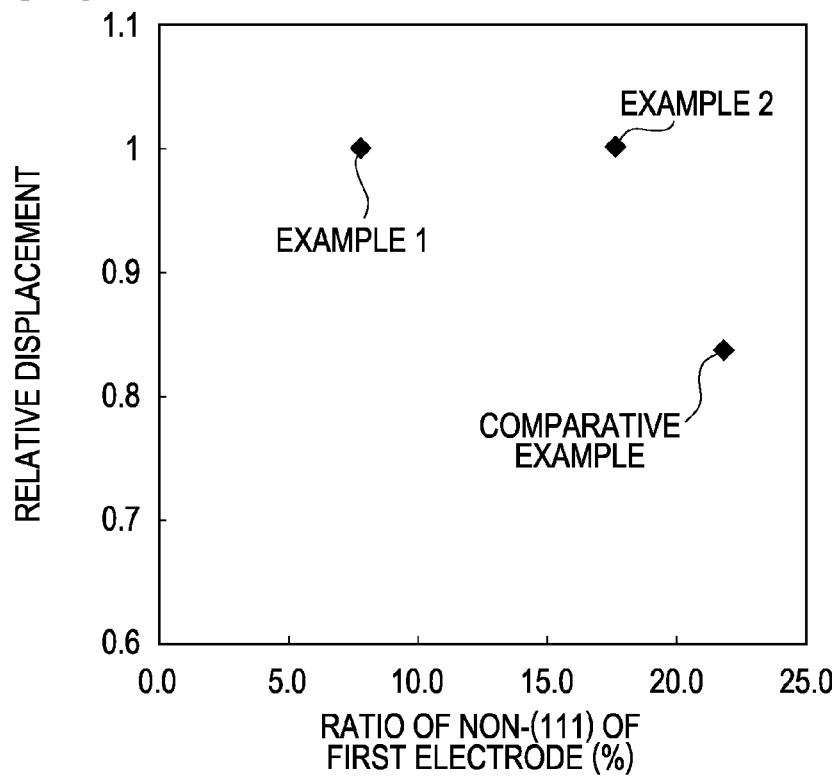
FIG. 5 is a graph illustrating the relative displacements for Examples and Comparative Example.

The same operation as in Example 1 was performed except that the pressure under which the platinum film and the iridium film were fabricated was changed to 0.3 Pa. By using the wide-angle X-ray diffraction method, it was found that the first electrode 60 was preferentially oriented (orientation ratio of 90% or more) along the (111) plane. The ratio of non-(111) calculated from the results of in-plane diffraction was 17.7%. In addition, by using the wide-angle X-ray diffraction method, the piezoelectric layer 70 was found to be preferentially oriented (orientation ratio of 90% or more) along the (100) plane. Diffraction peaks derived from a perovskite structure were also observed and therefore the piezoelectric layer 70 was confirmed as having a perovskite structure. Taking the amount of displacement of the piezoelectric element 300 of Example 1 to be 1, the relative displacement of this piezoelectric element 300 was 1. FIG. 5 illustrates the results.

Comparative Example

The same operation as in Example 1 was performed except that the pressure under which the platinum film and the iridium film were fabricated was changed to 0.5 Pa. By using the wide-angle X-ray diffraction method, it was found that the first electrode 60 was preferentially oriented (orientation ratio of 90% or more) along the (111) plane. The ratio of non-(111) calculated from the results of in-plane diffraction performed on the first electrode 60 was 21.9%. In addition, by using the wide-angle X-ray diffraction method, the orientation ratio along the (100) plane was found to be 65%. Diffraction peaks derived from a perovskite structure were also observed and therefore the piezoelectric layer 70 was confirmed as having a perovskite structure. The relative displacement of this piezoelectric element 300 was 0.84.

As can be seen from the above results, although these examples have first electrodes 60 from which similar diffraction intensities are obtained by the wide-angle X-ray diffraction method, Examples 1 and 2 that have a first electrode 60 whose ratio of non-(111) is 20% or less in in-plane diffraction have substantially higher orientation ratios for the piezoelectric layer 70 along the (100) plane and substantially larger amounts of displacement in comparison to Comparative Example that has a first electrode 60 whose ratio of non-(111) is more than 20%.

A lead electrode 90 composed of, for example, gold (Au) or the like is connected to each second electrode 80, which is a separate electrode of such piezoelectric elements 300. The lead electrode 90 extends from a portion near one end of a corresponding ink supply path 14 to the upper surface of an insulator film 55.

A protection substrate 30 having a reservoir section 31 that constitutes at least a part of a reservoir 100 is joined by an adhesive 35 to a passage-forming substrate 10 on which such piezoelectric elements 300 are formed, that is, to the first electrode 60, the insulator film 55, and the lead electrodes 90. In this embodiment, the reservoir section 31 extends through the protection substrate 30 in the thickness direction and is formed in the width direction of pressure-generating chambers 12. As described above, the reservoir section 31 communicates with a communicating section 13 in the passage-forming substrate 10 to form the reservoir 100 that is used as a common ink chamber for each pressure-generating chamber 12. The communicating section 13 in the passage-forming substrate 10 may be separated into plural sections for each pressure-generating chamber 12 and accordingly the reservoir section 31 may solely act as a reservoir. Alternatively, for example, the passage-forming substrate 10 may be provided with only the pressure-generating chambers 12 when the ink supply paths 14 that connect the reservoir 100 to each pressure-generating chamber 12 are provided in members between the passage-forming substrate 10 and the protection substrate 30 (for example, an elastic film 50, the insulator film 55, and the like).

A piezoelectric element containing section 32 that has a space that is large enough to contain the piezoelectric elements 300 without interfering with the operation of piezoelectric elements 300 is provided in the protection substrate 30 in a region opposite the piezoelectric elements 300. The piezoelectric element containing section 32 is usable when it has a space large enough to contain the piezoelectric elements 300 without interfering with the operation of piezoelectric elements 300. The space may be either sealed or open.

It is preferable for the protection substrate 30 to be formed of a material having substantially the same coefficient of thermal expansion as the passage-forming substrate 10. Such a material may be glass and a ceramic. In this embodiment, a silicon single-crystal substrate, which is the same material as for the passage-forming substrate 10, is used.

A through hole 33 is provided in the protection substrate 30 and extends through the protection substrate 30 in the thickness direction. The lead electrode 90 extending from each piezoelectric element 300 is provided so that a portion near one end of each lead electrode 90 is exposed through the through hole 33.

A drive circuit 120 that drives the piezoelectric elements 300 provided in parallel with one another is fixed to the protection substrate 30. For the drive circuit 120, for example, a circuit board or a semiconductor integrated circuit (IC) may be used. The drive circuit 120 and the lead electrodes 90 are electrically connected by connecting wires 121 that are formed of a conductive wire such as bonding wire.

A compliance substrate 40 having a sealing film 41 and a fixing plate 42 is joined to the protection substrate 30. The sealing film 41 is formed of a flexible material that has a low rigidity and seals one end of the reservoir section 31. The fixing plate 42 is formed of a relatively hard material. A region of the fixing plate 42 opposite the reservoir 100 with the sealing film 41 therebetween is an opening 43 that is completely omitted in the thickness direction. Therefore, one end of the reservoir 100 is sealed with only the sealing film 41 that has flexibility.

The above-described ink jet recording head I according to this embodiment receives ink through an ink inlet that is connected to an external ink supplier that is not shown. After the inside of the ink jet recording head I is filled with ink from the reservoir 100 to the nozzle orifices 21, a voltage is applied between the first electrode 60 and the second electrodes 80 corresponding to the respective pressure-generating chambers 12 in accordance with a recording signal from the drive circuit 120. As a result, the elastic film 50, the insulator film 55, the first electrode 60, and the piezoelectric layer 70 generate deflection to increase the pressure in each pressure-generating chamber 12, thereby discharging ink droplets from the nozzle orifices 21.

Other Embodiments

An embodiment of the invention has been described above, but the basic structure according to embodiments of the invention is not limited to the above-described one. For example, although a silicon single-crystal substrate is used as the passage-forming substrate 10 in the above embodiment, a silicon-on-insulator (SOI) substrate or a substrate formed of a material such as glass may be used instead.

Furthermore, although the piezoelectric element 300 in which the first electrode 60, the piezoelectric layer 70, and the second electrode 80 are stacked on a substrate (passage-forming substrate 10) in this order is used in the above embodiment, the invention can also be applied to a longitudinal vibration piezoelectric element in which piezoelectric materials and electrode-forming materials are alternately stacked, so that the piezoelectric element extends and contracts in the axial direction.

Figure 6:
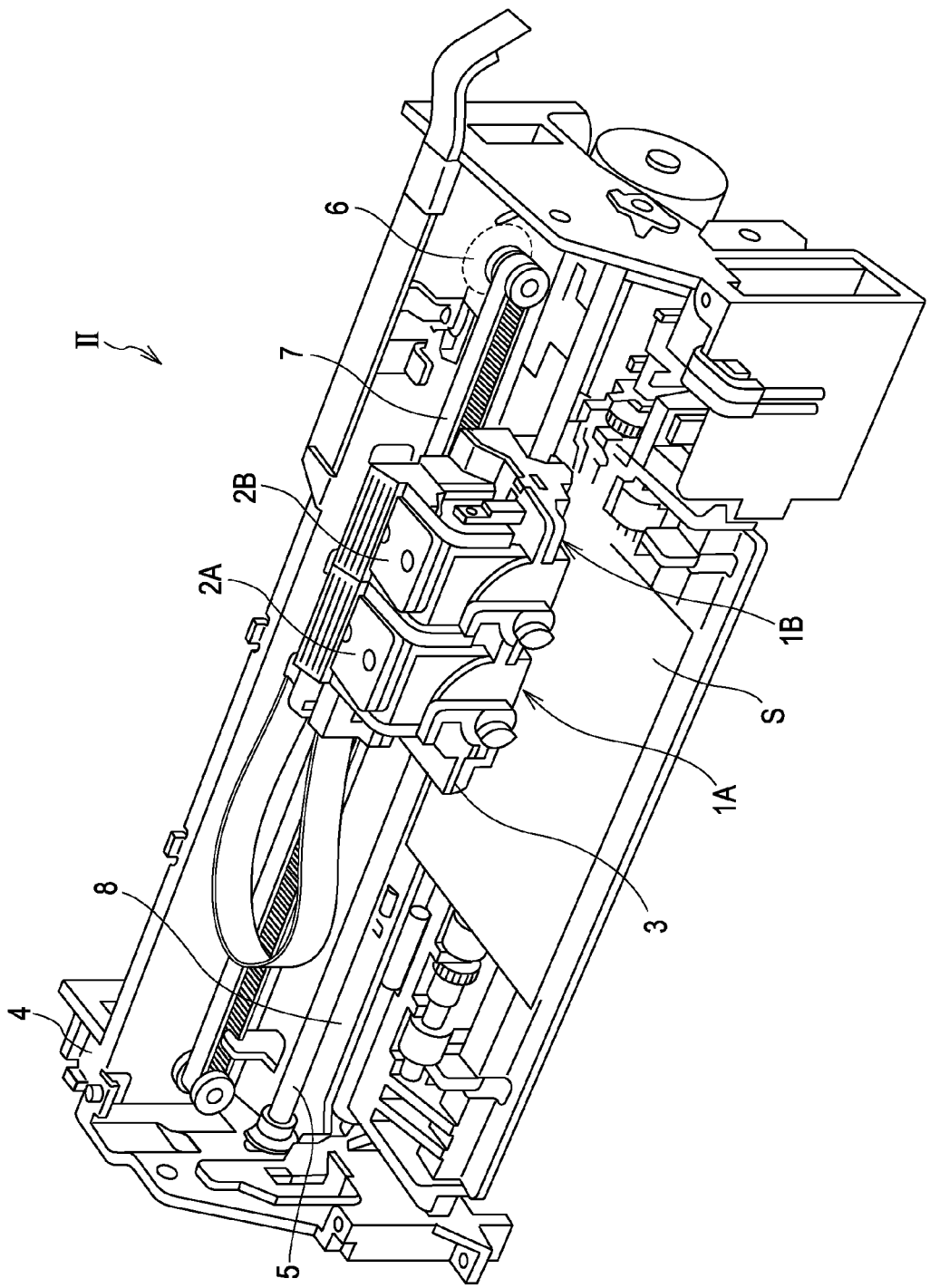
FIG. 6 is a drawing illustrating the general structure of a recording apparatus according to an embodiment of the invention.

Ink jet recording heads according to these embodiments each constitute a part of a recording head unit having an ink passage that communicates with an ink cartridge or the like, and are mounted in an ink jet recording apparatus. FIG. 6 is a schematic diagram that illustrates an example of the ink jet recording apparatus.

In an ink jet recording apparatus II illustrated in FIG. 6, cartridges 2A and 2B that form an ink supplier are removably attached to recording head units 1A and 1B. A carriage 3 on which the recording head units 1A and 1B are mounted is attached to a carriage shaft 5, which is mounted in an apparatus body 4, in a condition in which the carriage 3 can freely move in the shaft direction. The recording head units 1A and 1B are, for example, configured to discharge a black ink composition and a color ink composition, respectively.

When the driving force of a drive motor 6 is transmitted to the carriage 3 through a plurality of gears that are not shown and a timing belt 7, the carriage 3 on which the recording head units 1A and 1B are mounted moves parallel to the carriage shaft 5. A platen 8 is provided on the apparatus body 4 along the carriage shaft 5. A recording sheet S, which is a recording medium such as paper fed by a feeding roller or the like that is not shown, is picked up and transported by the platen 8.

Although an ink jet recording head is described in the above-described first embodiment as an example of a liquid ejecting head, the invention is intended for liquid ejecting heads in general and, needless to say, can be applied to liquid ejecting heads that eject a liquid other than ink. Such liquid ejecting heads include, for example, various recording heads that are used for an image-recording apparatus such as a printer, color-material-ejecting heads that are used to fabricate the color filters of a liquid crystal display and the like, electrode-material-ejecting heads that are used to form the electrodes of an organic EL display, an FED (field emission display), and the like, and living-organic-material-ejecting heads that are used to fabricate biochips.

In addition, the invention can be applied not only to piezoelectric elements that are mounted in liquid ejecting heads represented by ink jet recording heads, but also to piezoelectric elements that are mounted in ultrasonic devices such as a ultrasonic transmitter, pressure sensors, non-volatile memories, and other apparatuses.

What is claimed is:
1. A piezoelectric element comprising:
   a first electrode;
   a piezoelectric layer formed above the first electrode; and
   a second electrode formed above the piezoelectric layer,
   wherein the first electrode is preferentially oriented along a (111) plane in a direction parallel to a film surface and, in a direction perpendicular to the film surface, a sum of measured in-plane diffraction or electron backscatter diffraction (EBSD) intensities of the (111) plane and a (200) plane, to a sum of measured in-plane diffraction or electron backscatter diffraction (EBSD) intensities of the (111) plane, the (200) plane, and a (220) plane is 20% or less in terms of an abundance ratio.

2. The piezoelectric element according to claim 1, wherein the first electrode contains at least one element selected from platinum, iridium, palladium, and rhodium.

3. The piezoelectric element according to claim 1, further comprising:
   a layer containing titanium or titanium oxide provided above the first electrode, wherein the piezoelectric layer is provided above the layer containing titanium or titanium oxide.

4. A liquid ejecting head comprising the piezoelectric element according to claim 1.

5. A liquid ejecting apparatus comprising the liquid ejecting head according to claim 4.

6. The piezoelectric element according to claim 1, wherein a sum of the measured in-plane diffraction intensities of the (111) plane and a (200) plane, each intensity being normalized with a respective normalization coefficient, to a sum of measured in-plane diffraction intensities of the (111) plane, the (200) plane, and a (220) plane, each intensity being normalized with a respective normalization coefficient, is 20% or less in terms of an abundance ratio.

\* \* \* \* \*